United States Patent
Arae et al.

(10) Patent No.: US 10,312,373 B2
(45) Date of Patent: Jun. 4, 2019

(54) FIELD-EFFECT TRANSISTOR (FET) HAVING OXIDE INSULATING LAYER DISPOSED ON GATE INSULATING FILM AND BETWEEN SOURCE AND DRAIN ELECTRODES, AND DISPLAY ELEMENT, DISPLAY AND SYSTEM INCLUDING SAID FET, AND METHOD OF MANUFACTURING SAID FET

(71) Applicants: Sadanori Arae, Kanagawa (JP); Naoyuki Ueda, Kanagawa (JP); Yuki Nakamura, Tokyo (JP); Yukiko Abe, Kanagawa (JP); Shinji Matsumoto, Kanagawa (JP); Yuji Sone, Kanagawa (JP); Ryoichi Saotome, Kanagawa (JP); Minehide Kusayanagi, Kanagawa (JP)

(72) Inventors: Sadanori Arae, Kanagawa (JP); Naoyuki Ueda, Kanagawa (JP); Yuki Nakamura, Tokyo (JP); Yukiko Abe, Kanagawa (JP); Shinji Matsumoto, Kanagawa (JP); Yuji Sone, Kanagawa (JP); Ryoichi Saotome, Kanagawa (JP); Minehide Kusayanagi, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 97 days.

(21) Appl. No.: 15/349,211

(22) Filed: Nov. 11, 2016

(65) Prior Publication Data
US 2017/0141237 A1    May 18, 2017

(30) Foreign Application Priority Data

Nov. 17, 2015  (JP) .................................. 2015-224837
Oct. 13, 2016  (JP) .................................. 2016-201791

(51) Int. Cl.
*G09G 3/36*  (2006.01)
*G09G 3/34*  (2006.01)
(Continued)

(52) U.S. Cl.
CPC .. *H01L 29/78606* (2013.01); *H01L 21/02142* (2013.01); *H01L 21/47573* (2013.01);
(Continued)

(58) Field of Classification Search
CPC ............. H01L 27/3225; H01L 27/3241; H01L 27/283; H01L 27/2436; H01L 27/124;
(Continued)

(56) References Cited

U.S. PATENT DOCUMENTS

| 6,709,976 B1 * | 3/2004 | Kamin .............. H01L 21/76235 |
| | | 257/E21.55 |
| 2005/0116263 A1 * | 6/2005 | Lu ......................... C12Q 1/6825 |
| | | 257/252 |

(Continued)

FOREIGN PATENT DOCUMENTS

| JP | 2008-166716 | 7/2008 |
| JP | 2009-021612 | 1/2009 |
| JP | 2014-107527 | 6/2014 |

*Primary Examiner* — Darlene M Ritchie
(74) *Attorney, Agent, or Firm* — Cooper & Dunham LLP

(57) ABSTRACT

A field-effect transistor includes a gate electrode, a source electrode and a drain electrode to take out electric current according to an application of a voltage to the gate electrode, a semiconductor layer disposed adjacent to the source electrode and the drain electrode, the semiconductor layer forming a channel between the source electrode and the drain electrode, a first insulating layer as gate insulating film disposed between the semiconductor layer and the gate electrode, and a second insulating layer covering at least a (Continued)

part of a surface of the semiconductor layer, the second insulating layer including an oxide including silicon and alkaline earth metal.

13 Claims, 11 Drawing Sheets

(51) Int. Cl.
| | |
|---|---|
| H01L 29/786 | (2006.01) |
| H01L 21/8234 | (2006.01) |
| H01L 27/12 | (2006.01) |
| H01L 21/4757 | (2006.01) |
| H01L 21/4763 | (2006.01) |
| H01L 21/02 | (2006.01) |
| H01L 29/66 | (2006.01) |
| G02F 1/1368 | (2006.01) |
| H01L 27/32 | (2006.01) |

(52) U.S. Cl.
CPC ............ *H01L 21/47635* (2013.01); *H01L 21/823462* (2013.01); *H01L 27/124* (2013.01); *H01L 27/1225* (2013.01); *H01L 29/66969* (2013.01); *H01L 29/7869* (2013.01); *G02F 1/1368* (2013.01); *G09G 3/3406* (2013.01); *G09G 3/3648* (2013.01); *H01L 27/3262* (2013.01)

(58) Field of Classification Search
CPC ........... H01L 27/1225; H01L 21/02164; H01L 21/0228; H01L 21/02565; H01L 21/02554; H01L 21/823857; H01L 21/823462; H01L 29/0847; H01L 29/0154; H01L 29/517; H01L 29/401; H01L 29/42316; H01L 29/4234; H01L 29/51; H01L 29/7869; G09G 5/10; G09G 5/003; G09G 2300/0426; G09G 3/3225; G09G 3/3406; G09G 3/344; G09G 3/3648; G09G 3/348; G09G 2310/0264
See application file for complete search history.

(56) References Cited

U.S. PATENT DOCUMENTS

| | | | |
|---|---|---|---|
| 2006/0113539 A1* | 6/2006 | Sano | H01L 29/51 257/59 |
| 2009/0236596 A1* | 9/2009 | Itai | H01L 29/78618 257/43 |
| 2010/0025675 A1* | 2/2010 | Yamazaki | H01L 29/66742 257/43 |
| 2010/0295037 A1* | 11/2010 | Hironaka | H01L 29/78693 257/43 |
| 2011/0128275 A1* | 6/2011 | Ueda | H01L 27/1225 345/212 |
| 2012/0037901 A1* | 2/2012 | Mori | H01L 29/78693 257/43 |
| 2013/0240871 A1* | 9/2013 | Shimoda | B41J 2/161 257/43 |
| 2013/0248858 A1* | 9/2013 | Morita | C23C 14/086 257/43 |
| 2013/0285045 A1* | 10/2013 | Sasaki | H01L 29/7869 257/43 |
| 2013/0288435 A1* | 10/2013 | Kelwing | H01L 21/28088 438/197 |
| 2014/0061653 A1* | 3/2014 | Kim | H01L 29/66969 257/59 |
| 2014/0159026 A1* | 6/2014 | Okumoto | H01L 29/786 257/40 |
| 2015/0001531 A1 | 1/2015 | Ueda et al. | |
| 2015/0021599 A1* | 1/2015 | Ridgeway | C23C 16/345 257/43 |
| 2015/0108454 A1* | 4/2015 | Kim | H01L 29/7869 257/40 |
| 2015/0255327 A1* | 9/2015 | Park | H01L 27/124 438/668 |
| 2015/0263116 A1* | 9/2015 | Qiu | H01L 21/28581 257/194 |
| 2015/0325707 A1* | 11/2015 | Sano | H01L 21/428 257/43 |
| 2015/0349138 A1 | 12/2015 | Sone et al. | |
| 2016/0013215 A1 | 1/2016 | Ueda et al. | |
| 2016/0042947 A1 | 2/2016 | Nakamura et al. | |
| 2017/0133419 A1* | 5/2017 | Watanabe | H01L 31/101 |

* cited by examiner

FIELD-EFFECT TRANSISTOR (FET) HAVING OXIDE INSULATING LAYER DISPOSED ON GATE INSULATING FILM AND BETWEEN SOURCE AND DRAIN ELECTRODES, AND DISPLAY ELEMENT, DISPLAY AND SYSTEM INCLUDING SAID FET, AND METHOD OF MANUFACTURING SAID FET

CROSS-REFERENCE TO RELATED APPLICATIONS

This patent application is based on and claims priority pursuant to 35 U.S.C. § 119 to Japanese Patent Application Nos. 2015-224837 and 2016-201791, filed on Nov. 17, 2015 and Oct. 13, 2016, respectively, in the Japan Patent Office, the entire disclosures of which are hereby incorporated by reference herein.

BACKGROUND

Technical Field

The present invention relates to a field-effect transistor, a display unit, a display, and a system using the field-effect transistor, and a method of manufacturing the field-effect transistor.

Description of the Related Art

Field-effect transistors (FETs) which can be switched on and off by application of a gate voltage are applied to displays employing active matrix as thin film transistors (TFTs), etc.

Transistors of bottom gate type using an oxide semiconductor for a semiconductor layer forming a channel area of a TFT have been developed. In general, oxide semiconductors are easily dissolved in etching liquid. This makes it difficult to conduct wet-etching in which an acid is used to conduct patterning a source electrode and a drain electrode on an oxide semiconductor. For this reason, lift-off methods are used in general. However, the lift-off methods generally have trouble with fine patterning and improving production yield.

In an attempt to solve this issue, a method has been proposed which includes providing an etching stopper layer of silicon oxynitride ($SiO_x$) or silicon oxynitride ($SiO_xN_y$) on an oxide semiconductor to conduct etching a source electrode and a drain electrode.

As a protection layer to protect a thin-film transistor using an oxide semiconductor, a structure using a complex metal oxide including silicon (Si) and alkaline earth metal has been proposed.

As described above, if an etching stopper of silicon oxide ($SiO_x$) or silicon oxynitride ($SiO_xN_y$) is formed on an oxide semiconductor layer, silicon oxide and silicon oxynitride are prone to cracking, peeling-off, etc. during heating in the post-process. This causes deterioration of property and uniformity of TFTs.

SUMMARY

According to the present invention, provided is an improved field effect transistor including a gate electrode, a source electrode and a drain electrode to take out electric current according to an application of a voltage to the gate electrode, a semiconductor layer disposed adjacent to the source electrode and the drain electrode, the semiconductor layer forming a channel between the source electrode and the drain electrode, a first insulating layer as gate insulating film disposed between the semiconductor layer and the gate electrode; and a second insulating layer covering at least a part of a surface of the semiconductor layer, the second insulating layer including an oxide including silicon and alkaline earth metal

BRIEF DESCRIPTION OF THE SEVERAL VIEWS OF THE DRAWINGS

Various other objects, features and attendant advantages of the present invention will be more fully appreciated as the same becomes better understood from the detailed description when considered in connection with the accompanying drawings in which like reference characters designate like corresponding parts throughout and wherein.

Figure 1A:
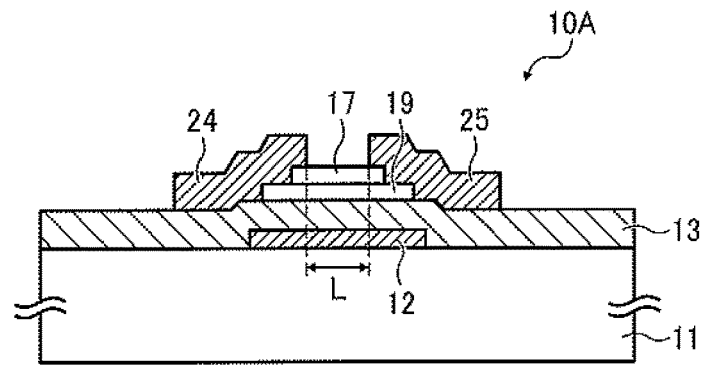
FIGS. 1A to 1C are diagrams illustrating configuration examples of a field-effect transistor according to embodiments of the present disclosure.

The accompanying drawings are intended to depict example embodiments of the present invention and should not be interpreted to limit the scope thereof. The accompanying drawings are not to be considered as drawn to scale unless explicitly noted. Also, identical or similar reference numerals designate identical or similar components throughout the several views.

DESCRIPTION OF THE EMBODIMENTS

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

As used herein, the singular forms "a", "an", and "the" are intended to include the plural forms as well, unless the context clearly indicates otherwise.

According to the present disclosure, provided is a field effect transistor free of peeling-off between the gate electrode, the source electrode and the drain electrode and the gate insulating layer due to heating process.

In embodiments of the present disclosure, a layer including an oxide containing silicon (Si) and alkaline earth metal is disposed on the surface of a semiconductor layer by wet processing.

More specifically, in the first embodiment, a field-effect transistor includes a gate electrode, a source electrode and a drain electrode to take out electric current according to an application of a voltage to the gate electrode, a semiconductor layer disposed adjacent to the source electrode and the drain electrode, the semiconductor layer forming a channel between the source electrode and the drain electrode, a first insulating layer as gate insulating film disposed between the semiconductor layer and the gate electrode; and a second insulating layer covering at least a part of a surface of the semiconductor layer, the second insulating layer including an oxide including silicon and alkaline earth metal.

In the second embodiment, a method of manufacturing a field-effect transistor includes forming a semiconductor layer, covering a surface of the semiconductor layer to form an insulating layer including an oxide including silicon and alkaline earth metal, covering the semiconductor layer and the insulating layer to form an electroconductive layer, and etching the electroconductive layer while using the insulating layer as an etching stopper to form a source electrode and a drain electrode adjacent to the semiconductor layer.

Embodiments of the present disclosure are described with reference to the accompanying drawings.

Figure 1B:
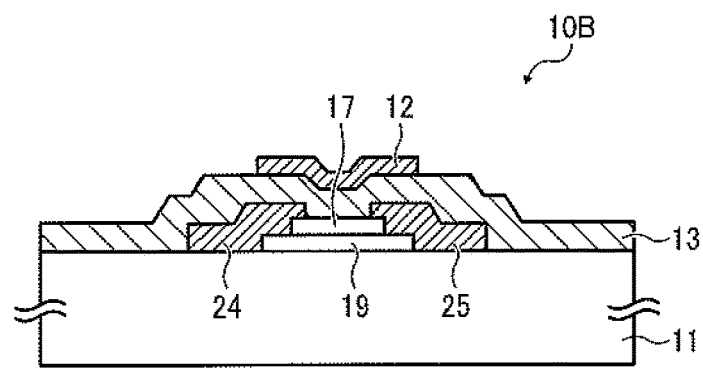
Figure 1C:
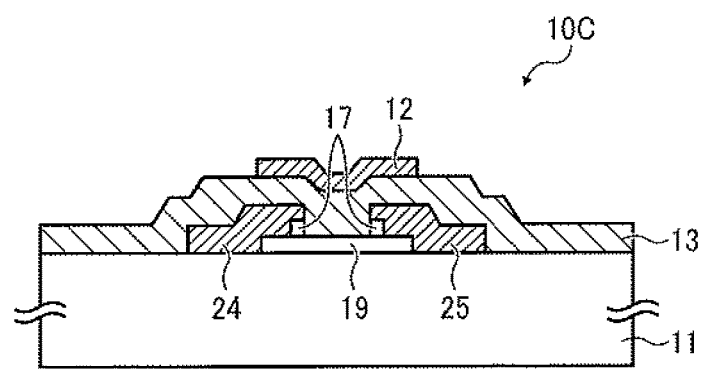

FIG. 1 is a diagram illustrating a configuration example of a field-effect transistor according to an embodiment of the present disclosure. FIG. 1A is a diagram illustrating a field-effect transistor 10A of bottom gate type. FIG. 1B is a diagram illustrating a field-effect transistor 10B of top gate type. The field-effect transistors 10A and 10B are suitably referred to as "field-effect transistor 10".

The field-effect transistors 10A and 10B include a gate electrode 12, a semiconductor layer 19, a gate insulating film (first insulating layer) 13 situated between the gate electrode 12 and the semiconductor layer 19, a source electrode 24, a drain electrode 25, and an insulating layer (second insulating layer) 17 covering a part of the surface of the semiconductor layer 19.

The insulating layer 17 includes an oxide including silicon (Si) and alkaline earth metal. The insulating layer 17 is etched (for example, wet-etched) to have a patterning having a predetermined form. The insulating layer 17 serves as an etching stopper during etching of the source electrode 24 and the drain electrode 25.

The field-effect transistor (FET) 10 illustrated in FIG. 1A includes a substrate 11, the gate electrode 12 formed on the substrate 11, the gate insulating film 13 covering the gate electrode 12, and the semiconductor layer 19 formed on the gate insulating film 13. The semiconductor layer 19 is formed of, for example, an oxide semiconductor. The source electrode 24 and the drain electrode 25 are formed at both ends of the semiconductor layer 19 in the channel length (L) direction.

The FET 10A is a transistor of bottom-gate type in which the gate electrode 12 is situated below the channel. In addition, the FET 10A is also a transistor of top-contact type in which the source electrode 24 and the drain electrode 25 forming the channel are situated on the semiconductor layer 19 in the lamination direction. At least the area extending between the source electrode 24 and the drain electrode 25 of the surface area of the semiconductor layer 19 is covered with the insulating layer 17.

In the FET 10B illustrated in FIG. 1B, the gate electrode 12 is situated above the semiconductor layer 19 formed on the substrate 11 along the lamination direction with the gate insulating film 13 therebetween. The semiconductor layer 19 is formed of, for example, an oxide semiconductor as in the case illustrated in FIG. 1A. The source electrode 24 and the drain electrode 25 are formed at both ends of the semiconductor layer 19 in the channel direction of the semiconductor layer 19.

The FET 10B is a transistor of top-gate type in which the gate electrode 12 is situated above the channel. In addition, the FET 10B is also a transistor of top-contact type in which the source electrode 24 and the drain electrode 25 forming the channel are situated above the semiconductor layer 19 in the lamination direction. At least the area extending between the source electrode 24 and the drain electrode 25 of the surface area of the semiconductor layer 19 is covered with the insulating layer 17.

In the FET 10A and the FET 10B, since the insulating layer 17 is processed by wet etching, damage to the semiconductor layer 19 and the substrate 11 is diminished. In addition, the insulating layer 17 can be used as an etching stopper as forming the source electrode 24 and the drain electrode 25 and damage to the semiconductor layer 19 and the substrate 11 is suppressed.

The insulating layer 17 includes an oxide including silicon (Si) and alkaline earth metal so that the insulating layer 17 is not easily cracked or peeled off during heating in the post-processing.

The insulating layer 17 is not particularly limited as long as the insulating layer 17 includes an oxide including silicon (Si) and alkaline earth metal. In addition, the composition of the insulating layer 17 can be suitably selected to suit to a particular application as long as the insulating layer 17 can protect the semiconductor layer 19 disposed below the insulating layer 17 from etching damage. The insulating layer 17 can be made of the oxide itself or may include other elements such as aluminum (Al) and boron (B). In addition, the insulating layer 17 may also include a solvent component. As the solvent to prepare a material including the oxide, man in the art may use any solvent he/she thinks of as appropriate.

Of the oxide, $SiO_2$ formed of Si is amorphous.

Alkaline earth metal severs Si—O bond so that the relative permittivity and linear expansion coefficient of the oxide can be controlled by adjusting the composition ratio of the alkaline earth metal.

Specific examples of the alkaline earth metal include, but are not limited to, berylium (Be), magnesium (Mg), calcium (Ca), strontium (Sr), barium (Ba), and radium (Ra). These can be used alone or in combination.

When the oxide includes Al or B, the insulating layer 17 is stable, forming amorphous $Al_2O_3$, $B_2O_3$, etc. Alkaline earth metal severs Al—O bond and Si—O bond so that the relative permittivity and linear expansion coefficient of the oxide can be controlled by adjusting the composition ratio of the alkaline earth metal.

FIGS. 2 to 4 are diagrams illustrating manufacturing processes of the field-effect transistor 10 according to embodiments of the present disclosure. The FET 10A and the FET 10B are the same in that the semiconductor layer 19 is covered with the insulating layer 17 to form the source electrode 24 and the drain electrode 25. Therefore, the manufacturing process is described taking the FET 10A as an example.

Figure 2A:
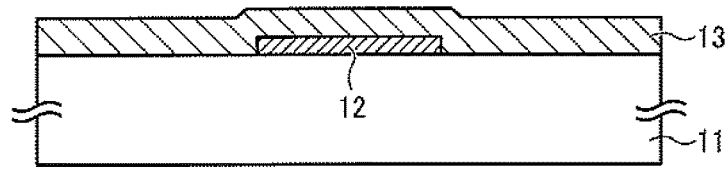
FIGS. 2A to 2D are diagrams illustrating manufacturing processes of a field-effect transistor according to an embodiment of the present disclosure.

The gate electrode 12 and the gate insulating film 13 covering the gate electrode 12 are formed on the substrate 11 (FIG. 2A).

The size, structure, form, and material of the substrate 11 of the substrate 11 are not particularly limited and can be suitably selected to suit to a particular application. The substrate 11 is made of, for example, glass or plastic, having a square form. The glass material is not particularly limited and can be suitably selected to suit to a particular application. For example, alkali-free glass and silica glass are suitable. Also, the plastic material is not particularly limited and can be suitably selected to suit to a particular application. For example, polycarbonate (PC), polyimide (PI), polyethylene terephthalate (PET), and polyethylene naphthalate (PEN) are suitable.

The substrate 11 may be subject to pre-treatment such as cleaning utilizing oxygen plasma, UV ozone, UV irradiation, etc. in terms of surface cleaning and improvement of adherence.

The gate electrode 12 is formed on the substrate 11. An electroconductive film is formed on the entire surface of the substrate 11 and patterning is conducted to have a predetermined form. The electroconductive film is not particularly limited. For example, it is possible to use metal or alloy such as molybdenum (MO), aluminum (Al), silver (Ag), and copper (CU), transparent electroconductive oxides such as indium tin oxide (ITO) and antimony tin oxide (ATO), and organic electroconductive substances such as polyethylene dioxythiophene (PEDOT) and polyaniline (PANI).

Films of these electroconductive materials are formed by dip coating method, etc. and thereafter subject to patterning by photolithography. Alternatively, films having a desired form can be directly printed using a print process such as inkjet, nanoinprint, and gravure.

The thickness of the gate electrode is selected to suit to a particular application. In this example, the thickness is 20 nm-1 μm and preferably 50-300 nm.

The gate insulating film 13 is formed on the entire surface of the substrate 11 and the gate electrode 12. The gate insulating film 13 can be made of using, for example, materials utilized to mass-produce $SiO_2$, $SiN_x$, etc., high dielectric materials such as $La_2O_3$, $HfO_2$, and $Y_2O_3$, and organic materials such as polyimide (PI) and fluorochemical resins.

The gate insulating film 13 can be formed by utilizing vacuum processing such as chemical vapor deposition (CVD) and atomic layer deposition (ALD) or a solution process (print method) such as spin coating, die coating, and inkjet. The thickness of the gate insulating film 13 is selected to suit to a particular application and the range is 50 nm-3 μm and preferably 100 nm-1 μm.

Figure 2B:
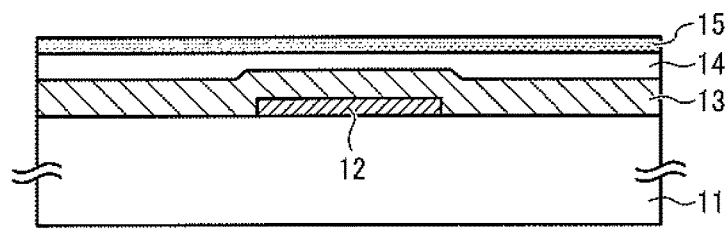

An oxide semiconductor layer 14 and an etching stopper layer 15 are formed (FIG. 2B). As the material for semiconductor, in addition to the oxide semiconductor, silicon semiconductor and organic semiconductor can be used. In this example, oxide semiconductor such as In—Ga—Zn—O and I-Z-O, and In—Mg—O is used. The oxide semiconductor layer 14 can be formed by utilizing vacuum processing such as sputtering method, a pulse laser deposition (PLD) method, CVD method, and ALD method or a solution process such as dip coating, spin coating, and die coating. The average thickness of the oxide semiconductor layer 14 is, for example, 5 nm-1 μm and preferably 10-500 nm.

The etching stopper layer 15 is formed on the oxide semiconductor layer 14 by, for example, spin coating. The etching stopper layer 15 is an amorphous layer including an oxide including silicon (Si) and alkaline earth metal and may furthermore optionally include aluminum and/or boron. The etching stopper layer 15 includes $SiO_2$, $Al_2O_3$, $B_2O_3$, BeO, MgO, CaO, SrO, BaO, RaO, etc. and the thickness is 10 nm-1 μm and preferably 30-500 nm. Subsequent to spin coating, drying in the temperature range of 80-180 degrees C. and baking in the temperature range of 200-400 degrees C. are conducted. Unnecessary moisture is removed by the drying and a complex metal oxide is produced by the baking.

Figure 2C:
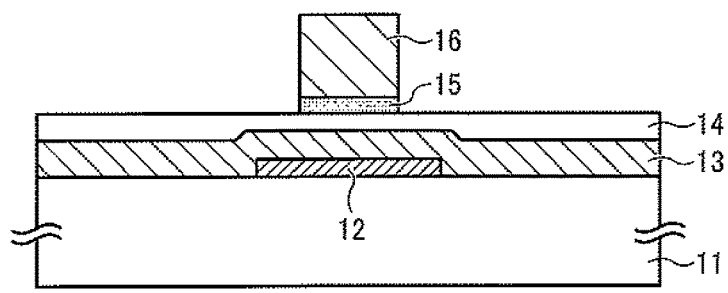

A resist 16 is formed at a predetermined position on the etching stopper layer 15 by exposure and development of photolithography (FIG. 2C). Using the resist 16 as a mask, the etching stopper layer 15 is processed to have a predetermined form by wet etching. The resist 16 is formed at the position corresponding to the channel of the field-effect transistor 10A and the etching stopper layer 15 is processed to have a form suitable to cover the channel.

As the etching liquid of wet etching, a solution having a high selection ratio (i.e., solution having a low etching rate) to the etching stopper layer 15 is used. For example, it is suitable to use etching liquid including at least one of ammonium hydrogen fluoride, ammonium fluoride, and hydrogen fluoride. By using such etching liquid, the etching stopper layer 15 can be processed utilizing the difference of the selection ratio (i.e., the difference of etching rate) between the etching stopper layer 15 and the oxide semiconductor layer 14 below the etching stopper layer 15 while suppressing damage to the oxide semiconductor layer 14.

Figure 2D:
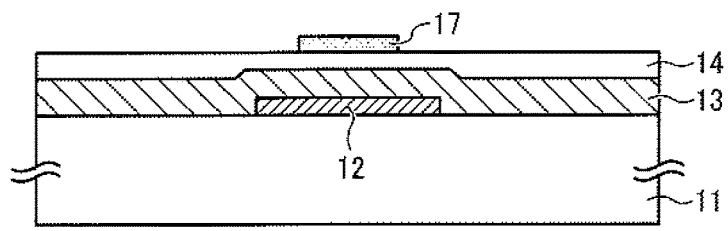

The resist 16 is peeled off followed by cleaning (FIG. 2D). As a result, the insulating layer 17 is formed at the position where the channel on the oxide semiconductor layer 14 is covered.

Figure 3A:
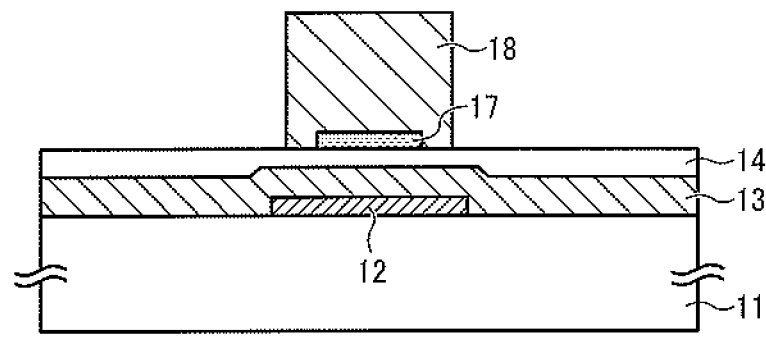
FIGS. 3A to 3C are diagrams illustrating manufacturing processes of a field-effect transistor according to an embodiment of the present disclosure.

A resist 18 is formed on a predetermined position on the substrate 11 and the oxide semiconductor layer 14 is processed to have a predetermined form using a diluted hydrofluoric acid liquid (FIG. 3A).

Figure 3B:
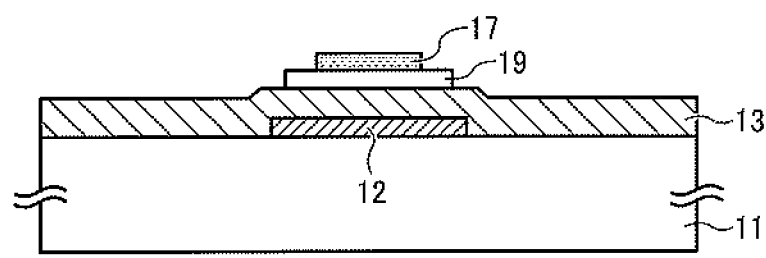

The resist 18 is peeled off followed by rinsing (FIG. 3B). The semiconductor layer 19 is formed at the position facing the gate electrode 12 with the gate insulating film 13 therebetween.

Figure 3C:
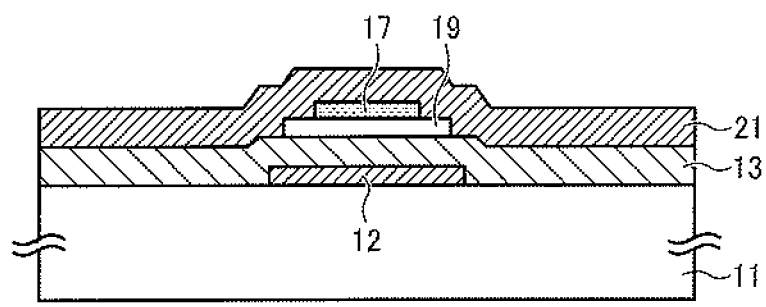

An electroconductive layer 21 is formed on the entire surface (FIG. 3C). The electroconductive layer 21 is used to form the source electrode and the drain electrode and the thickness is 20 nm-1 μm and preferably 50-300 nm. The material of the electroconductive layer 21 is selected to suit to a particular application. For example, Al, W, Mo, Zr, Hf, V, Nb, Ta, Cu, Co, Ni, Pt, Ti, Ag, Au, and alloys thereof are suitably used. Alternatively, transparent materials such as an oxide of indium and tin (ITO), an oxide of indium and zinc (IZO), zinc oxide (ZnO), and tin oxide ($SnO_2$) are also suitable.

Figure 4A:
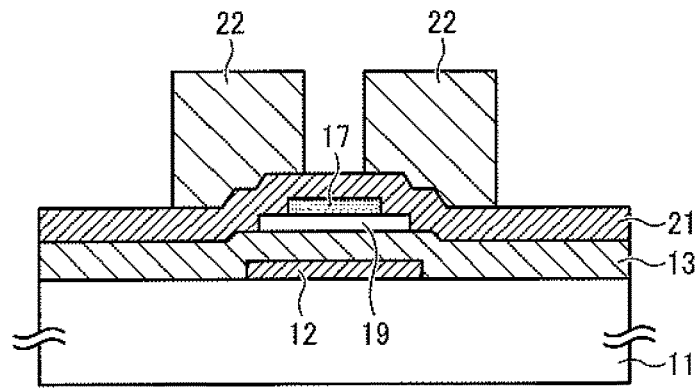
FIGS. 4A to 4C are diagram illustrating manufacturing processes of a field-effect transistor according to an embodiment of the present disclosure.
Figure 4B:
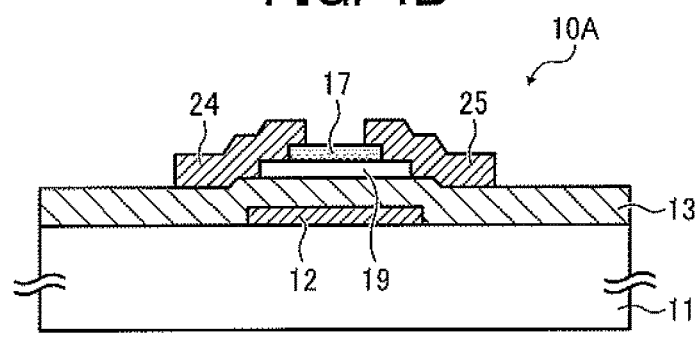

A resist 22 is formed on the electroconductive layer 21 (FIG. 4A).

Using the resist 22 as a mask, the electroconductive layer 21 is processed by etching to form the source electrode 24 and the drain electrode 25. In terms of fineness of patterns and processing of a large substrate, dry etching is preferable. For example, reactive ion etching (RIE) is suitable.

In general, dry etching damages an under layer, which is the semiconductor layer 19 using the oxide semiconductor in this example). In this embodiment, the insulating layer 17 on the semiconductor layer 19 serves as the etching stopper so that damage to the semiconductor layer 19 is prevented in the drying process. Thereafter, the resist 22 is peeled off followed by cleaning to manufacture the field-effect transistor 10A.

When the source electrode 24 and the drain electrode 25 are subject to wet etching, it is suitable to use the following combination of the electrode materials and the etching liquid.

The electrode material is at least one of ITO, molybdenum, aluminum, and zinc oxide (ZnO). ITO and ZnO are etched by etching liquid based on oxalic acid. Molybdenum and aluminum are etched by etching liquid based on PAN. Due to this selection, the source electrode 24 and the drain electrode 25 can be etched while maintaining the selection ratio to the etching stopper layer on the oxide semiconductor layer as the under layer (the oxide semiconductor layer as the background layer can be protected with the etching stopper layer not being removed).

Figure 4C:
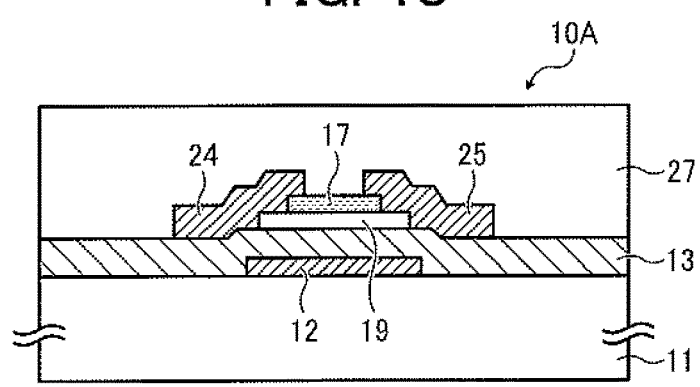

An interlayer insulating layer 27 is formed on the entire surface (FIG. 4C). Via plugs, capacitors, upper wires which are electrically connected to the field-effect transistor 10A by a known method are formed on a necessity basis.

The processes illustrated in FIG. 2B to FIG. 4B can be applied to the manufacturing of the field-effect transistor 10B of top gate type illustrated in FIG. 1B. In this case, damage to the semiconductor layer 19 can be also restricted when the insulating layer 17 is processed to have a predetermined form by wet etching. In addition, damage to the semiconductor layer 19 can be also restricted when the source electrode 24 and the drain electrode 25 are formed by dry etching using the insulating layer 17 as the etching stopper.

The etching stopper layer may be formed after forming the semiconductor layer by etching. In that case, the etching liquid selected to form the etching stopper layer does not etch the semiconductor layer as the under layer. TMHA aqueous solution is preferable as such etching liquid.

In the case of the field-effect transistor of top gate type as illustrated in FIG. 1B, the etching stopper layer (insulating layer) is disposed between the gate insulating film and the oxide semiconductor layer. When the thickness of the etching stopper layer (insulating layer) is thick, dielectric lowers, which may have an adverse impact on the property of TFT. For example, mobility lowers. To avoid this, like the field-effect transistor 10C illustrated in FIG. 1C, the etching stopper layer (the insulating layer 17) between the semiconductor layer 19 and the gate insulating film 13 may be removed. In the process of manufacturing the field-effect transistor 10C illustrated in FIG. 1C, a part of the etching stopper layer (the insulating layer 17) is removed in the manufacturing process of the field-effect transistor 10B illustrated in FIG. 1B. In the field-effect transistor 10C illustrated in FIG. 1C, the etching stopper layer (the insulating layer 17) is removed after forming the source electrode 24 and the drain electrode 25. Accordingly, a portion of the etching stopper layer (the insulating layer 17) disposed between the source electrode 24 and the drain electrode 25 and the semiconductor layer 19 remains without being removed.

As a method of removing the etching stopper layer, for example, using the source electrode and the drain electrode as a mask, the etching stopper layer on the oxide semiconductor is removed by etching liquid (for example, ammonium hydrogen fluoride, ammonium fluoride, and alkaline etching liquid such as TMAH aqueous solution).

In addition, when the gate insulating film is an oxide including Sr and La, the gate insulating film can be utilized as the etching stopper layer of an oxide semiconductor layer of In—Ga—Zn—O, I-Z-O, In—Mg—O, etc.

Figure 5:
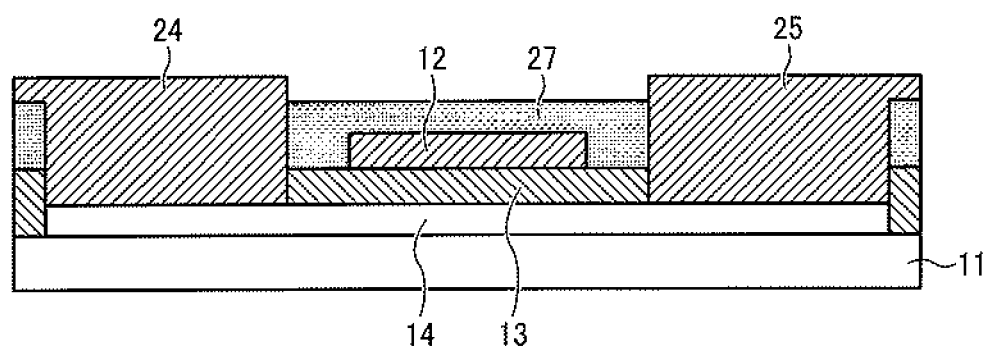
FIG. 5 is a diagram illustrating another configuration example of a field-effect transistor according to an embodiment of the present disclosure.

For example, when manufacturing the field-effect transistor as illustrated in FIG. 5, for example, if the gate electrode 12 is manufactured from an electroconductive layer by etching using PAN-based etching liquid, the gate insulating film 13 can be utilized as the etching stopper layer of the semiconductor layer 19 of In—Ga—Zn—O, I-Z-O, In—Mg—O, etc. In that case, when manufacturing a source electrode and a drain electrode, the gate insulating film 13 (etching stopper layer) is removed by using alkaline etching liquid such as TMAH aqueous solution to form a contact area of the oxide semiconductor and the source electrode and the drain electrode.

Having generally described preferred embodiments of this invention, further understanding can be obtained by reference to certain specific examples which are provided herein for the purpose of illustration only and are not intended to be limiting. In the descriptions in the following examples, the numbers represent weight ratios in parts, unless otherwise specified.

EXAMPLES

As described above, when the insulating layer 17 is formed on the semiconductor layer 19 by wet processing, damage to the semiconductor layer 19 can be prevented during both the processing of the insulating layer 17 and the processing of the semiconductor layer 19 and the drain electrode 25 using the insulating layer 17 as the etching stopper.

The insulating layer 17 of the embodiments are not easily cracked or peeled off during heating treatment in the post-processing. In Examples, it was confirmed that the cracking and peeling-off of the insulating layer 17 was prevented. Percent represents percent by mass unless otherwise specified in the following.

Preparation of Liquid Application of Etching Stopper

In the quantity in Examples 1 to 4 shown in Table 1, tetrabuthoxy silane (T5702-100G, manufactured by Sigma-Aldrich Corporation) as SiO2 source, aluminum di(s-buthoxide)acetoacetate chelate (Alfa 89349, Al content: 8.4 percent, manufactured by Alfa Aesar) as $Al_2O_3$ source, triisopropyl borate (Wako 320-41532, manufactured by WAKO CHEMICAL, LTD.) as $B_2O_3$ source, a mineral spirit solution of calcium 2-ethylhexanoate (Wako 351-01162, Ca content: 5 percent, manufactured by WAKO CHEMICAL, LTD.) as CaO source, and a toluene solution of strontium 2-ethylhexanoate (Wako 195-09561, Sr content: 2 percent, manufactured by Wako Pure Chemical Industries, Ltd.) were diluted with toluene to obtain a liquid application for use in forming the etching stopper layer 15.

The compositions of the metal oxides of Examples 1 to 4 prepared by the liquid application of etching stopper are shown in Table 1.

Evaluation of Appearance 0.4 mL of the liquid application of etching stopper was dripped to a glass substrate and spin coated under a predetermined condition (rotated for 5 seconds at 300 rpm and thereafter for 20 seconds at 3,000 rpm, and decreased to 0 rpm in 5 seconds).

Thereafter, subsequent to drying treatment at 120 degrees C. for one hour in atmosphere, the resultant was baked at 400 degrees C. for three hours in $O_2$ atmosphere to form a metal oxide insulating film (the etching stopper layer 15) of $SiO_2$—$Al_2O_3$—$B_2O_3$—CaO—SrO. The average thickness was about 30 nm.

As the heating treatment that would be conducted in an actual semiconductor device manufacturing process, the resultant was heated at 320 degrees C. for 30 minutes to evaluate the appearance. No peeling-off was observed in any composition of Examples 1 to 4 as shown in the column of "Appearance" of Table 1.

Manufacturing of Capacitor for Measuring Relative Permittivity

A capacitor was manufactured to measure relative permittivity of the insulating layer (dielectric layer) using the liquid application of etching stopper according to the compositions of Examples 1 to 4.

A lower electrode, a dielectric film, and an upper electrode were formed on a glass substrate. As the lower electrode, molybdenum (Mo) film having an average thickness of about 100 nm was formed by DC sputtering via a metal mask. Thereafter, using the liquid application of the etching stopper layer 15 of Examples 1 to 4, a dielectric film was formed in the same manner as in the evaluation of appearance. Thereafter, the upper electrode was formed on the dielectric film in the same process as in the case of forming the lower electrode. The average thickness of the dielectric film was about 30 nm.

The relative permittivity of the thus-manufactured capacitor was measured by LCR meter (4284A, manufactured by Agilent Technologies). The measuring results were as shown in the column of "Dielectric constant"

Manufacturing of Sample to Measure Linear Expansion Coefficient

1 L of the liquid application of etching stopper of each of the compositions of Examples 1 to 4 was prepared and the solvent was removed. Thereafter, the resultant was placed in a platinum crucible and melted by heating to 1,600 degrees C. Thereafter, a cylindrical object having a diameter of 5 mm and a height of 10 mm was manufactured by a floating method. Average linear expansion coefficient of the cylindrical object was measured in the temperature range of 20-300 degrees C. by a thermomechanical analyzer (8310 series, manufactured by Rigaku Corporation).

The manufactured cylindrical object has the same composition as in the case where the liquid applications of etching stopper of Examples 1 to 4 were used for the etching stopper layer 15 of the field-effect transistor 10A of bottom gate type and the values were same as to the linear expansion coefficient. The measuring results were as shown in the column of "Linear expansion coefficient" of Table 1.

As described later, the linear expansion coefficient of the samples of Examples 1 to 4 is greater by a digit of magnitude than $SiO_x$ etching stopper of known technology. As a result, cracking and peeling-off do not easily occur even after heating treatment.

TABLE 1

| | Example 1 | | Example 2 | | Example 3 | | Example 4 | |
|---|---|---|---|---|---|---|---|---|
| Oxide | Mass ratio of oxide Percent by mass | Oxide molar ratio Mol percent | Mass ratio of oxide Percent by mass | Oxide molar ratio Mol percent | Mass ratio of oxide Percent by mass | Oxide molar ratio Mol percent | Mass ratio of oxide Percent by mass | Oxide molar ratio Mol percent |
| $SiO_2$ | 61.0 | 67.5 | 62.8 | 70.0 | 50.9 | 60.3 | 62.3 | 70.3 |
| $Al_2O_3$ | 16.4 | 10.7 | 18.1 | 11.9 | 12.3 | 8.6 | 21.5 | 14.3 |
| $B_2O_3$ | 12.3 | 11.8 | 12.8 | 12.3 | 10.8 | 11.1 | 13.7 | 13.4 |
| MgO | — | — | — | — | — | — | — | — |
| CaO | 6.2 | 7.4 | 3.2 | 3.8 | 3.7 | 4.7 | 0.7 | 0.8 |
| SrO | 4.0 | 2.6 | 3.1 | 2.0 | 22.3 | 15.3 | 1.8 | 1.2 |
| BaO | — | — | — | — | — | — | — | — |
| Total | 100.0 | 100.0 | 100.0 | 100.0 | 100.0 | 100.0 | 100.0 | 100.0 |
| Dielectric constant | 5.5 | | 5.0 | | 6.0 | | 4.8 | |
| linear expansion coefficient ($\times 10^{-7}/k^{-1}$) | 36.4 | | 30.0 | | 50.3 | | 24.7 | |
| Appearance | No peeling-off | | No peeling-off | | No peeling-off | | No peeling-off | |

Comparative Example

As Comparative Example, the appearance was observed and the relative permittivity and linear expansion coefficient were measured for the case in which $SiO_x$ and $SiO_xN_y$ were used as the etching stopper as in known technology. The results are shown in Table 2.

For observation of the appearance, using $SiCl_4$ as a raw material, a $SiO_2$ layer was formed on a glass substrate according to plasma enhanced chemical vapor deposition (PECVD) method. The average thickness of the formed $SiO_2$ layer was about 30 nm as in Examples 1 to 4. Subsequent to heating treatment at 320 degrees C. for 30 minutes, the appearance was evaluated. Peeling-off was observed as shown in the evaluation results shown in Table 2.

In addition, to measure relative permittivity, a capacitor using $SiO_2$ film as a dielectric film was manufactured. A lower electrode of molybdenum (Mo) having an average film thickness of about 100 nm was formed on a glass substrate by DC sputtering via a metal mask in the same manner as in Examples 1 to 4. Thereafter, a dielectric film was formed using $SiO_2$ in the same process as in the observation of appearance. Thereafter, an upper electrode was formed on the dielectric film in the same process as in the case of forming the lower electrode to manufacture a capacitor. The average thickness of the dielectric film was about 30 nm.

The relative permittivity of the thus-manufactured capacitor was measured by LCR meter (4284A, manufactured by Agilent Technologies). The measuring result was 3.9 as shown in Table 2, which is lower than the values obtained in Examples 1 to 4.

Moreover, as a sample for measuring linear expansion coefficient, a cylindrical object having the same form as the object of Examples 1 to 4 was manufactured. $SiCl_4$ as a raw material was subject to hydrolysis in oxyhydrogen flame to grow silica powder to obtain a $SiO_2$ porous object. Thereafter, the porous object was melted at a high temperature of 1,600 degrees C. to manufacture a $SiO_2$ glass object having a cylindrical form having a diameter of 5 mm and a height of 10 mm. Average linear expansion coefficient of the cylindrical glass object was measured in the temperature range of 20-300 degrees C. by a thermomechanical analyzer (8310 series, manufactured by Rigaku Corporation). The measuring result is one digit smaller than the results of Examples 1 to 4 as shown in Table 2. Since the linear expansion coefficient is small, cracking and peeling-off tend to occur after heating treatment.

TABLE 2

| Oxide | Comparative Example | |
|---|---|---|
| | Mass ratio of oxide Percent by mass | Oxide molar ratio Mol percent |
| $SiO_2$ | 100 | 100 |
| $Al_2O_3$ | — | — |
| $B_2O_3$ | — | — |
| MgO | — | — |
| CaO | — | — |
| SrO | — | — |
| BaO | — | — |
| Total | 100 | 100 |
| Dielectric constant | 3.9 | |
| linear expansion coefficient ($\times 10^{-7}/k^{-1}$) | 5.0 | |
| Appearance | Peeling-off | |

As described above, the insulating layer 17 of the embodiments contributes to suppress the occurrence of cracking and peeling-off in the heating treatment in the post-process.

Application Example of Field Effect Transistor

Figure 6:
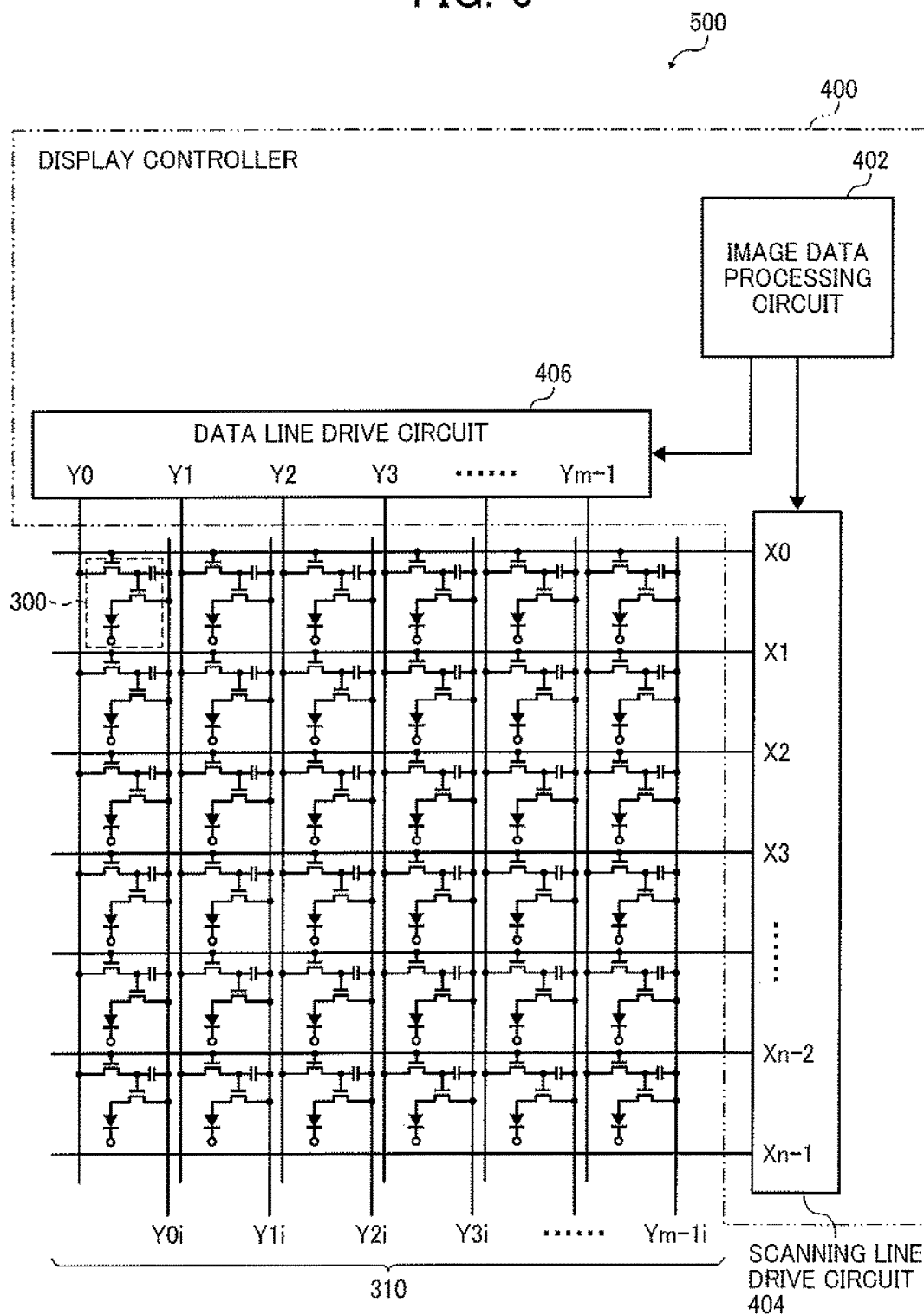
FIG. 6 is a diagram illustrating a circuit configuration example of the field-effect transistor illustrated in FIG. 1.

FIG. 6 is a diagram illustrating a circuit configuration of a display 500 to which the field-effect transistor 10 of the embodiment is applied. As the field-effect transistor 10 for use in the display 500, the field-effect transistor 10A of bottom gate type illustrated in FIG. 1A can be used. Also, the field-effect transistor 10B of top gate type illustrated in FIG. 1B can be used.

The display 500 includes a display unit 310 and a display controller 400. The display unit 310 includes multiple display elements 300 disposed in matrix. The display element 300 is connected to scanning lines (gate lines) X0 to Xn−1 and data lines (signal line or source line) Y0 to Ym−1 to form a matrix of M×N.

The display controller 400 includes a scanning line drive circuit 404 to make a selection from the scanning lines X0 to Xn−1, a data line drive circuit 406 to make a selection from the data lines Y0 to Ym−1, and an image data processing circuit 402 connected to the scanning line drive circuit 404 and the data line drive circuit 406. The display element 300 is determined by selection of the scanning line and the data line.

The image data processing circuit 402 controls luminance of each display element 300 of the display unit 310 based on the output signal from an image producing device, which is described later.

Figure 7:
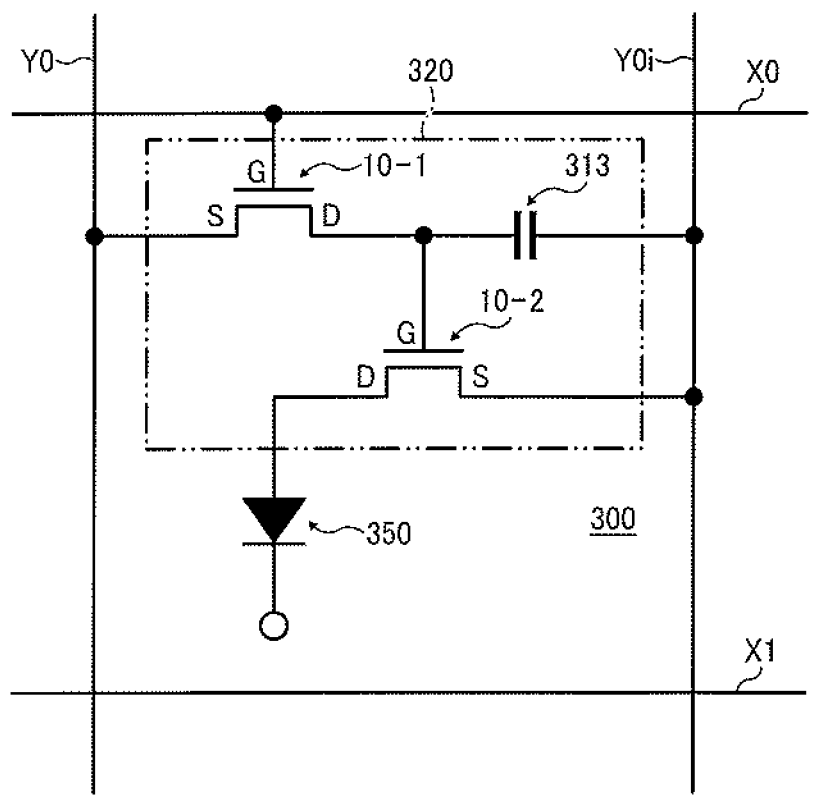
FIG. 7 is a circuit diagram of a display element for use in a display unit of the display illustrated in FIG. 6.

FIG. 7 is a circuit diagram illustrating the display element 300 illustrated in FIG. 6. The display element 300 includes an organic electroluminescent (EL) element 350 serving as a light control element and a drive circuit 320 to drive the organic EL element 350. The drive circuit 320 is of 2TFT type including two transistors 10-1 and 10-2 and a capacitor 313. A first transistor 10-1 is a switching transistor and a second transistor 10-2 is a drive transistor.

A gate G of the first transistor 10-1 is connected to the scanning line X0, a source S is connected to the data line Y0, and a drain D is connected to the gate G of the second transistor 10-2 and the capacitor 313. One terminal of the capacitor 313 is connected to the node between the first transistor 10-1 and the second transistor 10-2 and the other terminal is connected to a power line YOi.

The source S of the second transistor 10-2 is connected to a power source line YOi and the drain D is connected to the anode of the organic EL element 350. When the display element 300 is selected and the first transistor 10-1 is electrically conducted, a voltage is applied to the gate of the second transistor 10-2 and the current flows in the organic element 350, namely, the switch is on.

In the transistors 10-1 and 10-2 for use in each display element 300, damage to the semiconductor layer 19 serving as a channel is restricted and cracking and peeling-off do not easily occur, so that the transistors 10-1 and 10-2 have uniform properties. Therefore, uniform luminescence property is maintained in the entire of the display unit 310.

Figure 8:
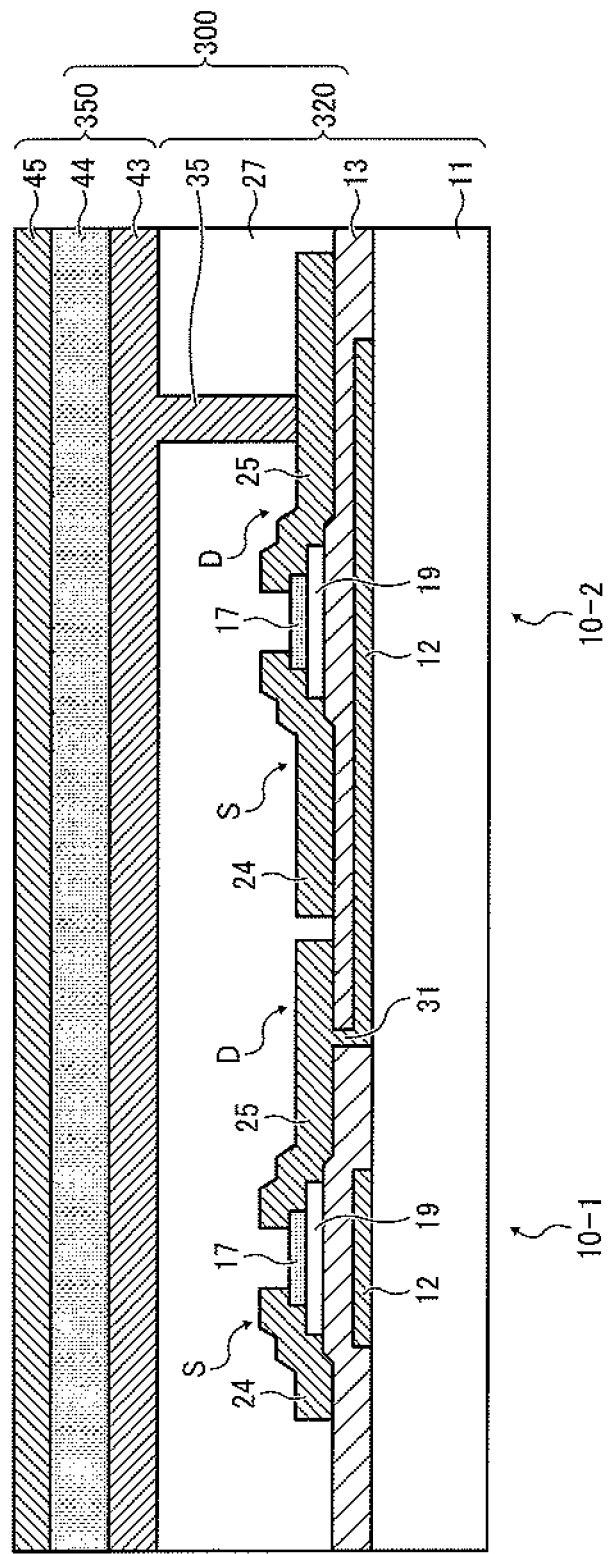
FIG. 8 is a schematic diagram illustrating a cross-section of a configuration example of the display element illustrated in FIG. 7.

FIG. 8 is diagram illustrating a vertical cross section of the display element 300 for the circuit configuration illustrated in FIG. 7. The display element 300 is of lamination type and includes the organic EL element 350 disposed on the drive circuit 320 in the vertical direction to the substrate. This configuration is advantageous in terms of reducing the area per pixel.

In the organic EL element 350, an electrode 43, an organic EL layer 44, and an electrode 45 are laminated in this sequence. The electrode 43 is connected to the drain electrode of the second transistor 10-2 by a via plug 35.

In FIG. 8, the electrode 43 is an anode electrode and the electrode 45 is a cathode electrode. Light is taken out downward. Therefore, it is preferable that the electrode 43, the gate electrode 12, the source electrode 24, and the drain electrode be made of transparent electrode materials such as ITO. When using such a transparent electrode material, the semiconductor layer 19 of an oxide semiconductor, etc. is protected from damage caused by dry etching of the source electrode 24 and the drain electrode 25.

When taking out light from upward of the display element 300, the polarity is reversed. That is, the electrode 45 is set as an anode made of a transparent material such as ITO.

The element configuration of the display element 300 is not limited to the example illustrated in FIG. 8. The organic EL element 350 may be horizontally disposed adjacent along with the drive circuit 320.

Figure 9:
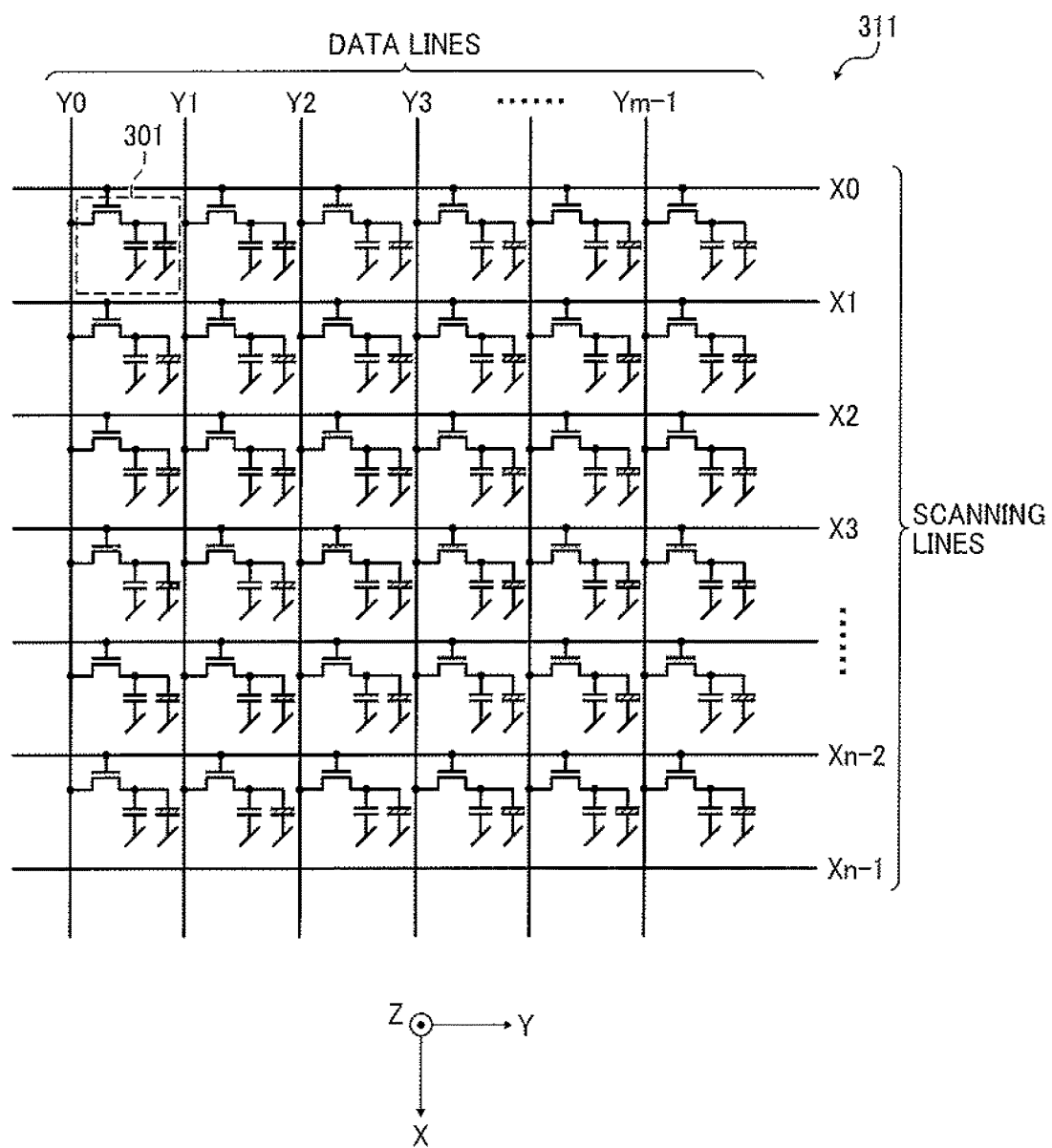
FIG. 9 is a diagram illustrating another circuit configuration example of the display unit of the display illustrated in FIG. 6.

It is also suitable to use a display unit 311 illustrated in FIG. 9 instead of the display unit 310 of the display 500 illustrated in FIG. 6.

FIG. 9 is a circuit diagram illustrating the display unit 311. The display unit 311 includes multiple display elements 301 disposed in matrix. The scanning lines X0 to Xn−1 to select one of the display elements 301 are connected to the scanning line drive circuit 404 illustrated in FIG. 6 and the data lines Y0 to Ym−1 are connected to the data line drive circuit 406 illustrated in FIG. 6.

Figure 10:
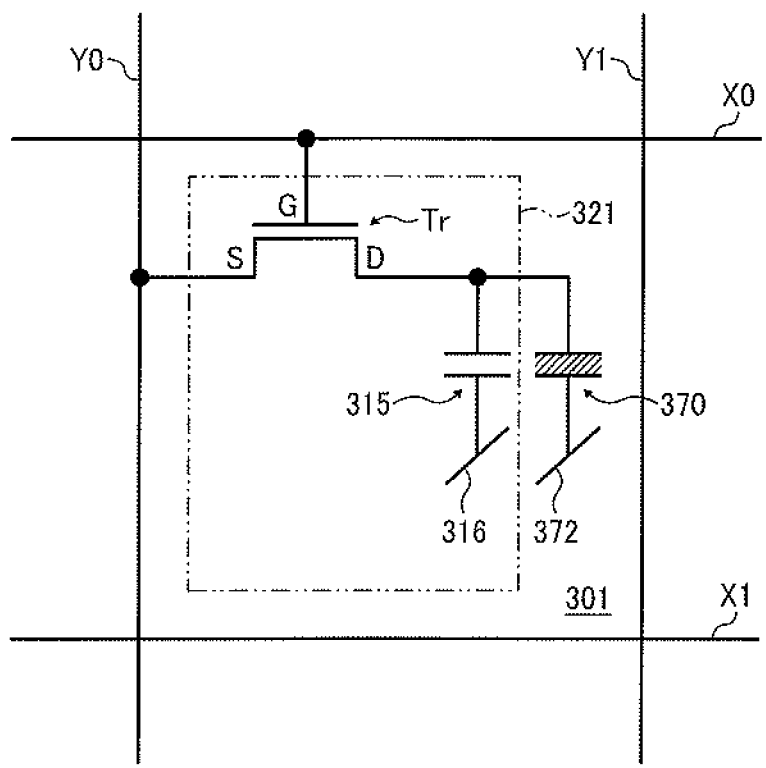
FIG. 10 is a circuit diagram of a display element for use in a display unit illustrated in FIG. 9.

FIG. 10 is a circuit diagram illustrating the display element 301 illustrated in FIG. 9. The display element 301 includes a liquid crystal element 370 serving as a light control element and a drive circuit 321 to drive the liquid crystal element 370. The drive circuit 321 is of 1TFT type including a transistor Tr as the field-effect transistor 10 and a capacitor 315.

The gate G of the transistor Tr is connected to the scanning line X0, the source S is connected to the data line Y0, and the drain D is connected to the capacitor 315 and the liquid crystal element 370. The other terminal of the capacitor 315 is connected to a common electrode 316. Similarly, the other terminal of the liquid crystal element 370 is connected to a common electrode 372.

When the display element 301 is selected and the transistor Tr is electrically conducted, a current flows in the liquid crystal element 370, namely, the switch is on.

In the transistor Tr for use in each display element 301, damage to the semiconductor layer 19 serving as a channel is restricted and cracking and peeling-off do not easily occur so that the transistor Tr has uniform properties. Therefore, uniform luminescence property is maintained in the entire of the display unit 311.

Figure 11:
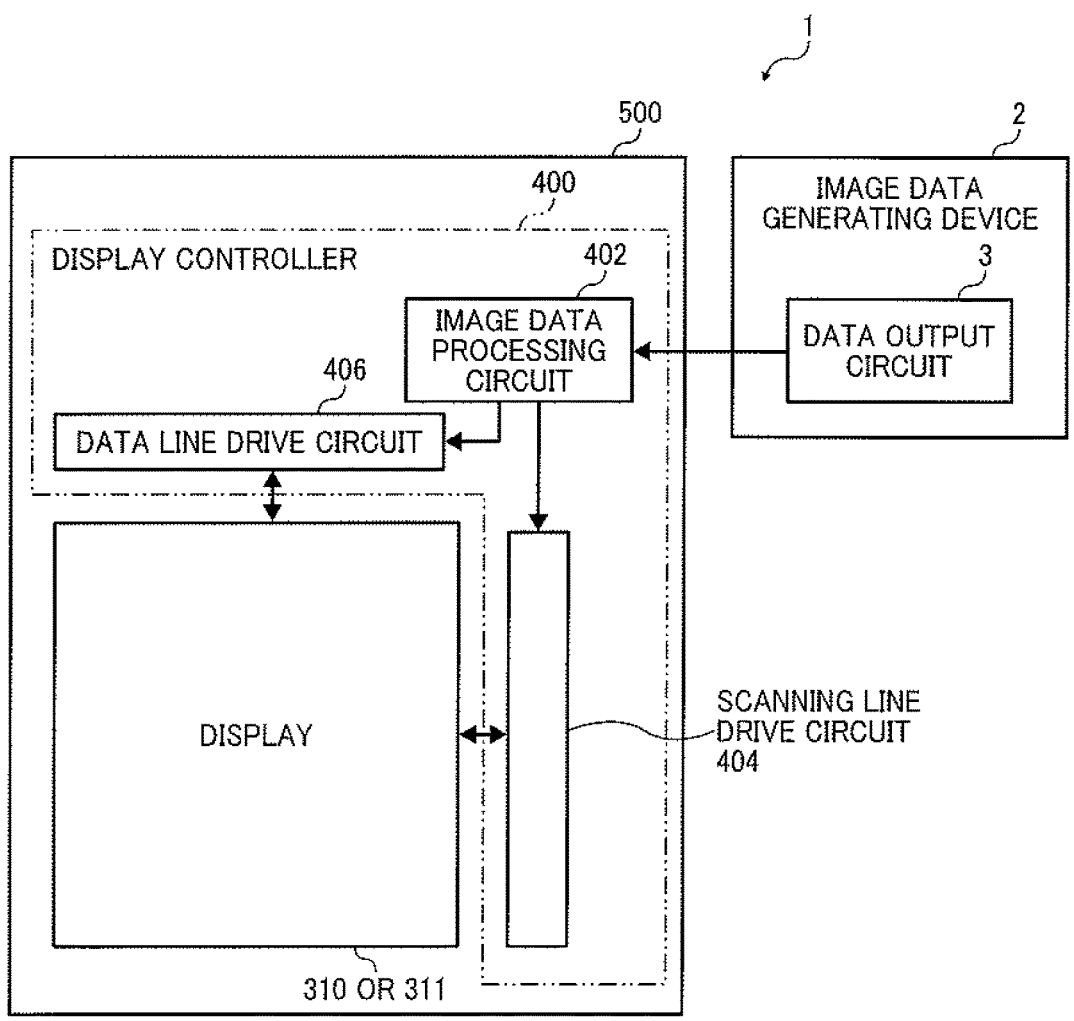
FIG. 11 is a schematic diagram illustrating a system using the display illustrated in FIG. 6.

FIG. 11 is a schematic diagram illustrating a system 1 using the display 500 illustrated in FIG. 6. The system 1 includes the display 500 and an image data creating device 2. The image data creating device 2 includes a data output circuit 3. Video data or image data output from the data output circuit 3 is input into the image data processing circuit 402 of the display 500 to control luminance. Data supply from the image data creating device 2 to the display 500 is not limited to physical cables. Wireless connection is also possible.

The system 1 is applied to electronic devices such as personal digital assistance, computers, digital video cameras, and television sets and video systems for use in outdoor advertisement, concerts, etc. The display 500 is used as a display for those electronic devices and systems, monitor displays, video screens, etc. The image data creating device 2 may have imaging function, computer graphic function, computing function, etc. and store image data (video data) supplied from outside.

Each display element of the display unit 310 or 311 of the display 500 has uniform operation property and display property because damage to the semiconductor layer 19 serving as the channel of the drive transistor and cracking and peeling-off are suppressed.

Therefore, this is advantageous when applied to a system including a giant screen.

The particular embodiments of the present disclosure are described but the present disclosure is not limited thereto.

For example, the light control element of the display element is not particularly limited to a particular kind as long as the element controls light output according to drive signals and can be suitably selected to suit to a particular application. In addition to the organic element 350 and the liquid crystal element 370, inorganic electroluminescent elements, electrochromic (EC) elements, electrophoresis elements, and electrowetting elements can be also used.

The display 500 can be used as a display device of various information for not only personal digital assistance, digital video cameras, and television sets, and advertising media but also still cameras and mobile systems such as vehicles, airplanes, trains, and ships. Moreover, it is possible to apply to displays for various information in measuring systems, analyzing devices, and medical equipment.

According to the present disclosure, degradation of properties and uniformity of a thin-film transistor is prevented while suppressing damage to a semiconductor layer and a substrate.

Having now fully described embodiments of the present invention, it will be apparent to one of ordinary skill in the art that many changes and modifications can be made thereto without departing from the spirit and scope of embodiments of the invention as set forth herein.

What is claimed is:

1. A field-effect transistor comprising:
a gate electrode;
a source electrode and a drain electrode;
a semiconductor layer disposed adjacent to the source electrode and the drain electrode;
a first insulating layer as gate insulating film disposed between the semiconductor layer and the gate electrode; and
a second insulating layer covering at least a part of a surface of the semiconductor layer, the second insulating layer including an oxide including silicon and an alkaline earth metal, wherein molar percent of alkaline earth oxides in the second insulating layer is smaller than molar percent of silicon oxides in the second insulating layer, and wherein the second insulating layer is an etching stopper layer having a form covering at least an area where a channel is formed between the source electrode and the drain electrode.

2. The field-effect transistor according to claim 1, wherein the second insulating layer is etched to have a predetermined form.

3. The field-effect transistor according to claim 1, wherein a top surface of the semiconductor layer in a lamination direction of a substrate abuts the source electrode and the drain electrode, and
wherein the second insulating layer is disposed at a part of a connection interface between the semiconductor layer and the source electrode and a part of a connection interface between the semiconductor layer and the drain electrode.

4. The field-effect transistor according to claim 1, wherein the second insulating layer further includes at least one of aluminum and boron.

5. The field-effect transistor according to claim 1, wherein the semiconductor layer is formed of an oxide semiconductor.

6. A display element comprising:
a drive circuit to output a drive signal, the drive circuit including the field-effect transistor of claim 1; and
a light control element to control light output according to the drive signal from the drive circuit.

7. The display element according to claim 6, wherein the light control element includes at least one of an electroluminescent element, an electrochromic element, a liquid crystal element, an electrophoresis element, and an electrowetting element.

8. A display comprising:
a display unit including multiple display elements, each of which is the display element of claim 6; and
a display control device configured to individually control the multiple display units.

9. A system comprising:
the display of claim 8; and
an image data generating device to supply image data to the display.

10. A method of manufacturing a field-effect transistor, comprising:
forming a first insulating layer as gate insulating film on a gate electrode and a substrate,
forming a semiconductor layer on the first insulating layer, with the first insulating layer interposed between the semiconductor layer and the gate electrode;
forming a second insulating layer covering at least a part of a surface of the semiconductor layer, the second insulating layer including an oxide including silicon and an alkaline earth metal;
covering the semiconductor layer and the second insulating layer to form an electroconductive layer; and
etching the electroconductive layer while using the second insulating layer as an etching stopper to form a source electrode and a drain electrode, adjacent to the semiconductor layer,
wherein molar percent of alkaline earth oxides in the second insulating layer is smaller than molar percent of silicon oxides in the second insulating layer.

11. The method according to claim 10, further comprising:
forming an initial etching stopper layer on the surface of the semiconductor layer, and etching the initial etching stopper layer to form the second insulating layer, before the step of the etching the electroconductive layer.

12. The method according to claim 11, wherein the step of etching the second insulating layer is conducted using etching liquid including at least one of ammonium hydrogen fluoride, ammonium fluoride, and hydrogen fluoride.

13. The method according to claim 10, wherein the step of etching the electroconductive layer is conducted using dry etching.

* * * * *